United States Patent [19]
Kang et al.

[11] Patent Number: 5,327,130
[45] Date of Patent: Jul. 5, 1994

[54] SPUR-FREE SIGMA-DELTA MODULATOR AND MULTIPLE FLUX QUANTA FEEDBACK GENERATOR

[75] Inventors: Joonhee Kang, Plum Boro; John X. Przybysz, Penn Hills; Donald L. Miller, Penn Township, Westmoreland County, all of Pa.

[73] Assignee: Westinghouse Electric Corp., Pittsburgh, Pa.

[21] Appl. No.: 103,844

[22] Filed: Aug. 9, 1993

[51] Int. Cl.$^5$ .................. H03M 3/00; G01R 19/00
[52] U.S. Cl. ...................... 341/133; 341/143; 341/171; 324/127; 324/248
[58] Field of Search ............ 341/133, 143, 171, 155, 341/149; 375/177, 178, 180; 324/127, 248; 505/827, 845, 842, 846

[56] References Cited

U.S. PATENT DOCUMENTS

| | | | |
|---|---|---|---|
| 4,315,255 | 2/1982 | Harris et al. | 340/347 |
| 4,672,359 | 6/1987 | Silver | 341/133 X |
| 4,866,373 | 9/1989 | Harada et al. | 341/133 X |
| 4,977,402 | 12/1990 | Ko | 341/133 |
| 4,983,971 | 1/1991 | Przybysz et al. | 341/133 |
| 5,019,818 | 5/1991 | Lee | 341/133 |
| 5,140,324 | 8/1992 | Przybysz et al. | 341/133 |
| 5,192,951 | 3/1993 | Ko | 341/133 |
| 5,198,815 | 3/1993 | Przybysz et al. | 341/133 |

OTHER PUBLICATIONS

V. K. Kaplunenko et al, "Experimental Study of the RSFQ Logic Elements," *IEEE Trans. Magn.*, vol. MA-G-25, pp. 861–864, Mar. 1989.

James C. Candy, "A Use of Double Integration in Sigma Delta Modulation", *IEEE Trans. Comm.*, vol. COM-33, pp. 249–258, Mar. 1985.

*Primary Examiner*—Sharon D. Logan
*Attorney, Agent, or Firm*—R. P. Lenart

[57] ABSTRACT

A spur-free sigma delta modulator analog-to-digital converter for converting an analog input signal to a digital output signal is provided. A race Josephson junction is provided between the pulse generator and the integrating inductor. The race Josephson junction emits a voltage pulse in response to every sampling pulse. This voltage pulse kills any retained persisting current in the integrating inductor. By adding the race Josephson junction, nonlinearities in the converter are eliminated.

A multiple flux quanta feedback generator for creating a multiple digital pulse feedback in response to an input signal is provided. A quantizer connected to the input inductor produces a pulse when the current produced by the input inductor exceeds a predetermined amount. A splitter is connected to the quantizer for producing output pulses. In order to produce $2^n$ output pulses, $2^n-1$ splitters are required. Each of the splitters produces two output pulses in response to a single pulse produced by the quantizer. Each of the $2^n$ output pulses drives one of $2^n$ feedback pulse generators. Each of the feedback pulse generators is connected to one of the output pulses to produce $2^n+1$ quanta feedback which is fed back to the input inductor.

9 Claims, 6 Drawing Sheets

SPUR-FREE SIGMA-DELTA MODULATOR AND MULTIPLE FLUX QUANTA FEEDBACK GENERATOR

BACKGROUND OF THE INVENTION

1. Field Of The Invention

This invention relates to analog-to-digital converters, and, more particularly, to spur-free superconductive sigma-delta analog-to-digital converters and multiple flux quanta feedback generators used therein.

2. Description Of Related Art

Sigma-delta converters are a class of analog-to-digital converters. The basic sigma-delta converter utilizes an integrator to which the analog signal to be converted is applied. A single rough comparator operating at high speed converts the output of the integrator to a single digital signal. The comparator is combined with a digital-to-analog converter to form a quantizer. A digital filter converts the high speed single bit output of the quantizer into a multi-bit digital output. The converter also includes a feedback loop including the comparator, the digital-to-analog converter and the integrator. The quantizer samples the integrator output at a rate many times the Nyquist rate. The rate of the multi-bit output signal is a function of the sampling rate and the number of bits in the output signal. The feedback in the sigma-delta converter integrates the error in the least significant bit, thereby shifting quantization noise, which limits the dynamic range of conventional analog-to-digital converters, to frequencies above the frequency of the analog input signal. The chief advantage of sigma-delta converters is that they substitute high speed digital signal processing for the high precision analog circuits required in conventional analog-to-digital converters.

Our commonly owned patent application Ser. No. 07/710,856 filed on Jun. 6, 1991, since issued as U.S. Pat. No. 5,140,324 on Aug. 18, 1992, discloses a sigma-delta converter implemented with superconducting elements and operated with GHz sampling rates to provide high resolution for megahertz signals. This superconducting sigma-delta converter utilizes a superconducting inductor as the integrator, a Josephson junction as the quantizer and Superconducting Quantum Interface Device (SQUID) to generate GHz rate sampling pulses. When the sum of a sampling pulse plus the inductor current generated by the supeconducting inductor exceeds a critical current, the Josephson junction generates a voltage pulse which represents a digital "ONE" output. The voltage pulse also provides feedback to the superconducting inductor. This feedback is very precise and stable as each voltage pulse generated by the Josephson junction is a flux quantum.

Our commonly owned patent application Ser. No. 07/807,040 filed on Dec. 12, 1991, since issued as U.S. Pat. No. 5,198,815 on Mar. 30, 1993, discloses a two loop superconducting sigma-delta analog-to-digital converter which includes a first superconducting inductor to which the analog signal is applied. A resistor converts the current in the first inductor to a voltage which is applied to a second superconducting inductor. The current in the second inductor, which increases quadratically with time, is applied to an overdamped Josephson junction which kicks back a single quantum voltage pulse each time its critical current is exceeded. This voltage pulse reduces the current in the second inductor and serves as a digital "ONE" output. The pulses are also applied to an underdamped Josephson junction in a feedback pulse generator which latches at its gap voltage for the remainder of a half cycle of an AC bias current. This provides a voltage source for the primary of a superconducting transformer having a mutual inductance which provides sufficient flux in the secondary to cause a SQUID to generate in response to each pulse from the quantizer a selected number of feedback pulses which are applied to the first inductor.

Our commonly owned patent application Ser. No. 07/945,803 filed on Sep. 16, 1992 discloses a bandpass sigma-delta modulator for analog-to-digital converters in which an RLC circuit connected to the input analog signal is resonant at an intermediate frequency. A Josephson junction connected to the RLC circuit receives the current flowing through the RLC circuit. The Josephson junction emits a voltage pulse which reduces the RLC circuit current when the current in the Josephson junction exceeds its critical current. Selected multiples of the voltage pulse generated by the Josephson junction are fed back to the RLC circuit. A digital output is generated from the voltage pulses generated by the Josephson junction to complete the analog-to-digital conversion of the input signal.

Figure 1:
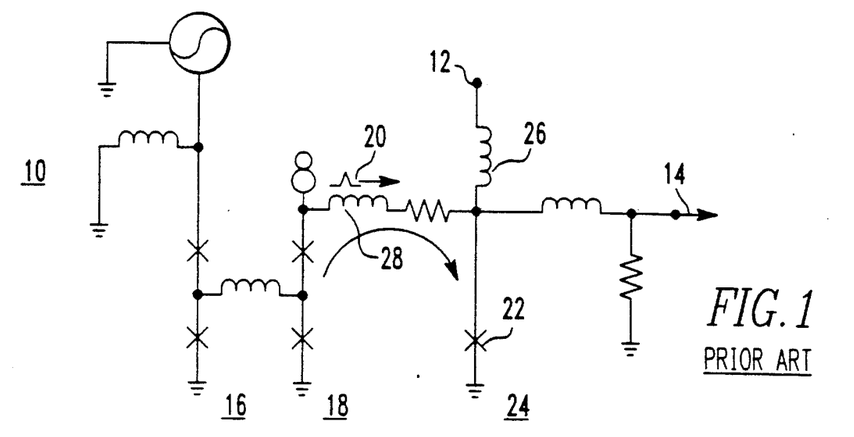
FIG. 1 is a schematic circuit diagram of a prior art single junction comparator.

Although satisfactory for their intended purpose, these modulators have difficulty obtaining 95 dB of Spur-Free Dynamic Range (SFDR) required by certain new applications. The problem with these previous modulators is illustrated in FIG. 1. FIG. 1 shows a prior art modulator 10 having an analog input 12 and a digital output 14. Pulse generator 16 and pulse sharpener 18 create a sampling pulse 20 that is fired at the comparator junction 22 in the quantizer 24. The voltage of the analog input 12 is integrated as current in the sigma inductor 26 in accordance with the following equation:

$$I = \int dI = \int [V(t')/L] dt'$$

When the sum of the integrating inductor current and the sampling pulse current exceeds the critical value, comparator junction 22 is forced momentarily into the voltage state. This produces the output data_1 pulse, quenches the current pulse in the sampling input inductor 28, and reduces the sigma inductor 26 current (delta feedback).

When the sum of the currents flowing into quantizer 24 does not exceed the critical value, comparator junction 22 does not pulse. No output pulse appears, data_0. The sigma inductor 26 continues to integrate the input signal. The lack of a kickback pulse against the sampling inductor 28 leaves a slowly decaying current in the loop, which includes the comparator junction 22. Some of this current persists into the next sampling interval.

Figure 2A:
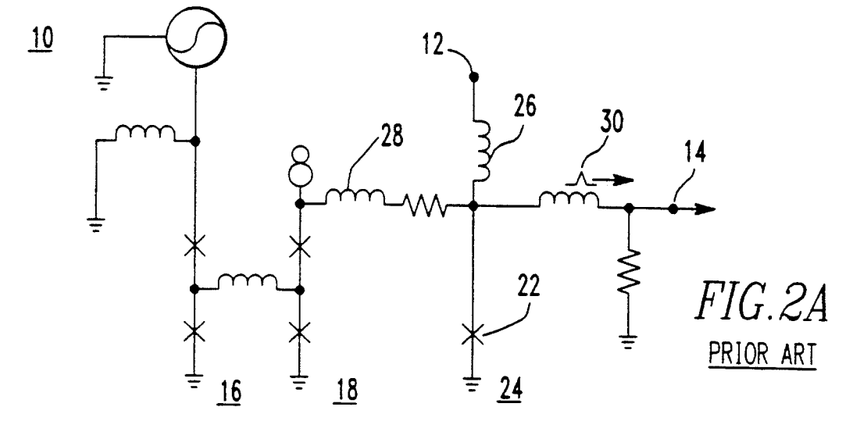
FIG. 2A is a schematic circuit diagram of the prior art circuit of FIG. 1 wherein an output data_1 pulse is produced.
Figure 2B:
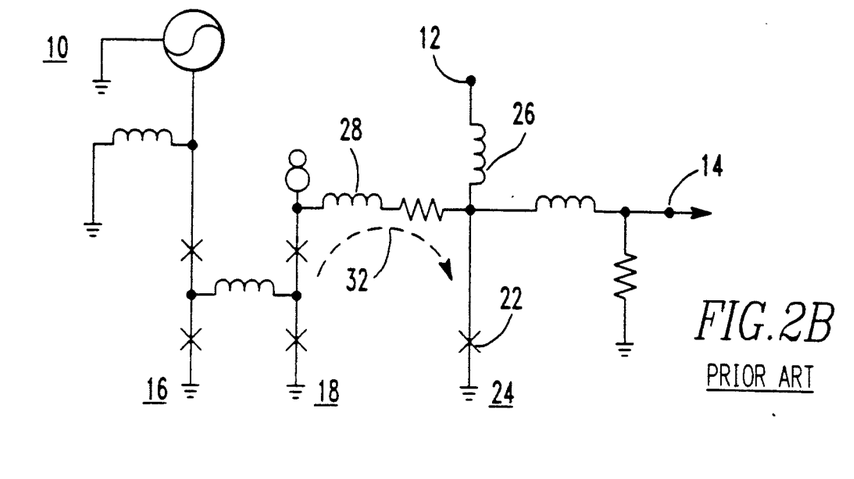
FIG. 2B is a schematic circuit diagram of the prior art circuit of FIG. 1 wherein no output data signal is produced.

The persistence of the sampling current into the next sampling interval is shown in FIGS. 2A and 2B. In FIG. 2A, the production of the output data_1 pulse 30 is demonstrated. In this situation, prior art modulator 10 works fine. However, when no output pulse appears as shown in FIG. 2B, the persistent sampling current 32 continues to exist.

Figure 3:
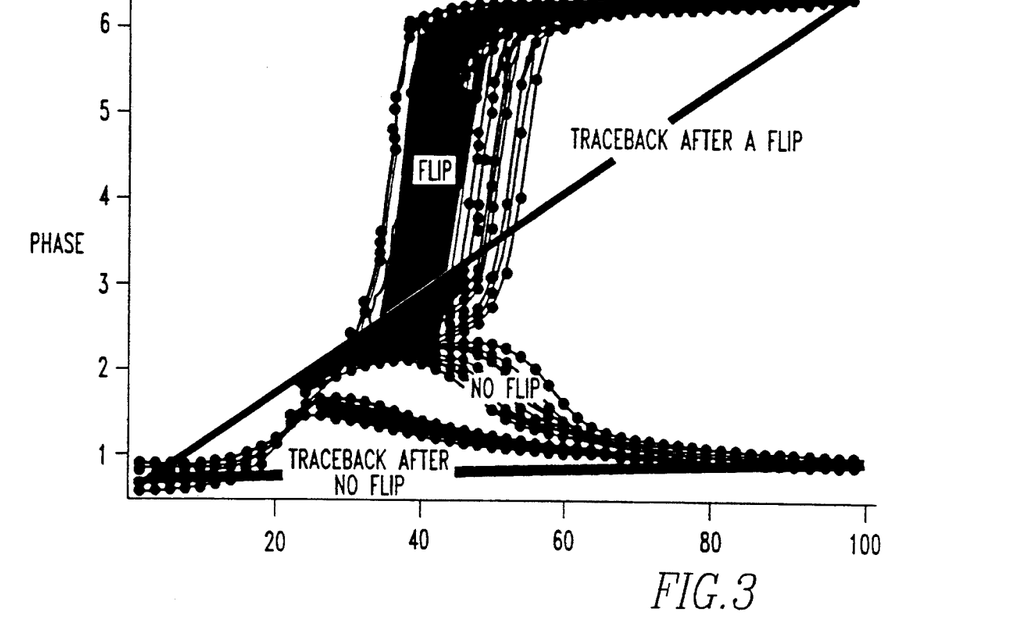
FIG. 3 is an oscilloscope reading of a typical operation of the prior art modulator circuit of FIG. 1.

The effect of the persistent sampling current is shown in FIG. 3. A JSIM calculation (a SPICE-like Josephson circuit simulator) was used to model a single loop modulator 10 having a dc input voltage which was subjected to 396 sampling pulses. The phase of the sampling junction is plotted, oscilloscope-style, in FIG. 3. Data_1 events caused a 2-pi flip in junction phase. Data_0 events caused momentary changes in junction phase, followed by decay back to the starting point. The traceback from "no flip" goes to a higher phase than the traceback from a "flip", due to the persistent current 32 in the sampling inductor 28.

The direct consequence of the two different starting points is that it is more difficult to get a data_1 following a data_1 than after a data_0, since the traceback from the first data_1 is to the lower starting point. Conversely, this also means that it is easier to get a data_0 following a data_1 that after a data_0. This shift in threshold causes a non linearity in the analog-to-digital conversion process.

Figure 4:
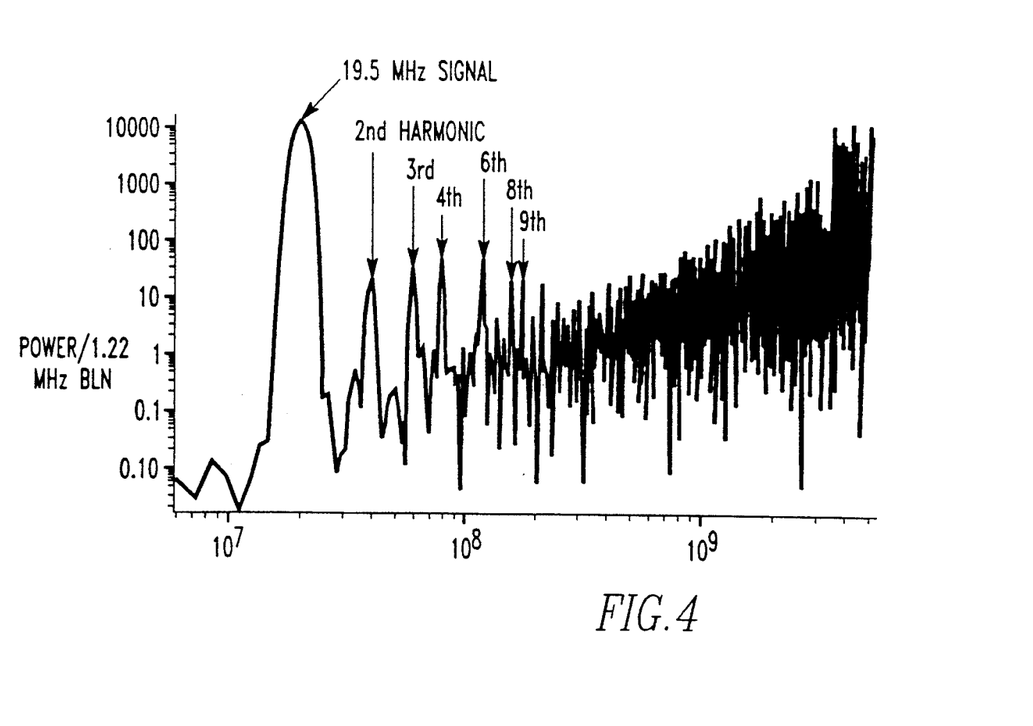
FIG. 4 is a plot of the FFT of the output data of the prior art modulator circuit of FIG. 1.

This non-linear effect was demonstrated in a longer JSIM calculation. The input was an offset sine wave of 11 microvolts dc plus a 5 microvolt peak-to-peak, 19.5 MHz signal. The FFT of the modulator output data_1s and data_0s is plotted in FIG. 4. The prominent spurs at the n=2, 3, 4, 6, 8, and 9 harmonics were produced by the analog-to-digital converter 10. The ratio of signal power to second harmonic power was only 29 dB. Because of this performance, there is a need for a sigma-delta modulator which reduces this nonlinearity.

Superconductive sigma-delta modulators use single flux quantum (SFQ) pulses for sampling at rates up to 100 GHz and are capable of high-dynamic range analog-to-digital conversion of megahertz signals. Magnetic flux contained in a loop containing a Josephson junction is quantized in units of single flux quantum, $\phi_o$. This also defines the size of voltage pulses generated by Josephson junctions, the so called SFQ pulses. These pulses are used in digitizing analog electric signals to a very fine scale and in constructing very high speed and ultra low power digital electronics.

Many SFQ circuit elements, operable at above 100 GHz, have been developed in the last few years several circuits have demonstrated operation ar speeds of 100 GHz with a power of tens of nanowatts. Most digital circuits are operated with single pulses and do not require a series of multiple pulses. Devising a circuit which can convert multiple SFQ pulses into an analog signal is useful in constructing many SFQ signal processing circuits, particularly sigma-delta analog-to-digital converters.

To make superconductive sigma-delta modulators useful for practical applications for sampling at rates of up to 100 GHz, two or more feedback loops with multiple pulse feedback are required. The performance of these modulators critically depends on the proper design of the multiple pulse feedback circuit. Previous attempts to simulate proper operation of various multiple pulse feedback circuits have not been successful. Consequently, there is a need for a multiple pulse feedback circuit.

SUMMARY OF THE INVENTION

A spur-free sigma-delta modulator analog to-digital converter for converting an analog input signal to a digital output signal is provided in which integrating inductor means are connected to the analog input signal. Pulse generator means are connected to the integrating inductor means, the pulse generator means creating a sampling pulse. Quantizer means are connected to the integrating inductor means. The quantizer means includes a comparator Josephson junction which measures the current in the integrating inductor means and the sampling pulse and produces an output pulse when the current in the integrating inductor means and the sampling pulse exceeds a predetermined level. A race Josephson junction is provided between the pulse generator means and the integrating inductor means. The race Josephson junction emits a voltage pulse in response to every sampling pulse, the voltage pulse killing any retained persisting current in the integrating inductor means. By adding the race Josephson junction, nonlinearities are eliminated.

A multiple flux quanta feedback generator for creating a multiple digital pulse feedback in response to an input signal is provided in which the input inductor means is connected to the input signal. Quantizing means which are connected to the input inductor means produce a pulse when the current produced by the input inductor means exceeds a predetermined amount. Splitting means are connected to the quantizing means for producing output pulses. In order to produce $2^n$ output pulses, $2^n-1$ splitting means are required. Each of the splitting means produces two output pulses in response to a single pulse produced by the quantizing means. Each of the $2^n$ output pulses drives one of $2^n$ feedback pulse generator means. Each of the feedback pulse generator means is connected to one of the output pulses to produce $2^n+1$ quanta feedback which is fed back to the input inductor means.

DETAILED DESCRIPTION OF THE PREFERRED EMBODIMENTS

Figure 5:
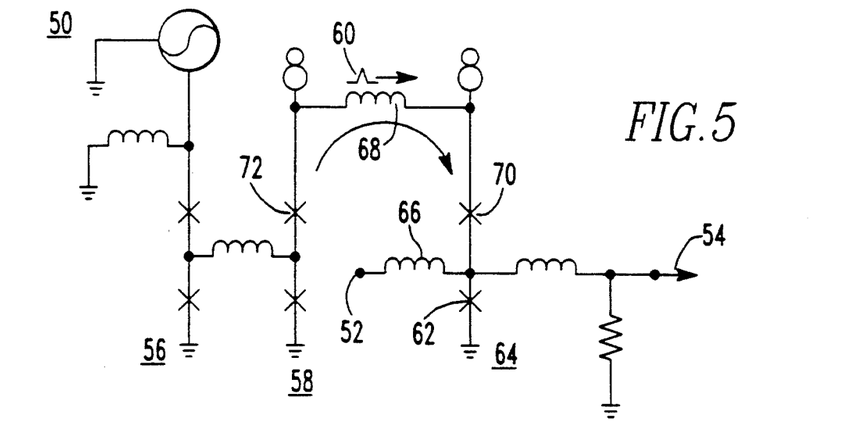
FIG. 5 is a first presently preferred embodiment of the spur-free sigma-delta modulator of the present invention.

Linearity in the analog-to-digital conversion process has been achieved by using a second Josephson junction comparator in the modulator. A first presently preferred embodiment of the improved modulator 50 is shown in FIG. 5. Modulator 50 receives analog input 52 and produces digital output 54. Pulse generator 56 and pulse sharpener 58 create a sampling pulse 60 that is fired at comparator junction 62 in quantizer 64. Similar to prior art modulators, the analog input 52 voltage is integrated as current in the sigma inductor 66. Unlike the prior art modulator 10, however, a kickback voltage is supplied to sampling inductor 68. This kickback voltage is produced by race Josephson junction 70.

Race Josephson junction 70 and its associated DC bias source are added to quantizer 64 and provide the main difference between modulator 50 and prior art modulator 10. The new race Josephson junction 70 has a smaller critical current than the comparator Josephson junction 62, typically only 70 percent of its critical current. Race Josephson junction 70 emits a voltage pulse and responds to every sampling pulse 60. This voltage pulse kills the persisting current in the sampling input inductor 68. When comparator junction 62 pulses to produce data_1, upper pulse buffer junction 72 also pulses which again kills any persistent current in sampling input inductor 68.

Figure 6:
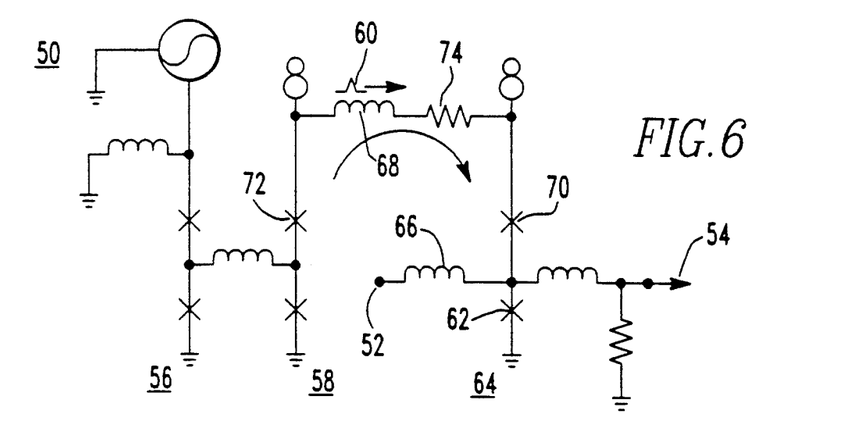
FIG. 6 is a second presently preferred embodiment of the spur-free sigma-delta modulator of the present invention.

FIG. 6 shows an alternative embodiment to the modulator 50 of FIG. 5. In the modulator of FIG. 6, resistor 74 is provided between sampling input inductor 68 and quantizer 64. Although critical for use in modulator 10, resistor 74 is not needed if race Josephson junction 70 is provided in modulator 50.

Figure 7:
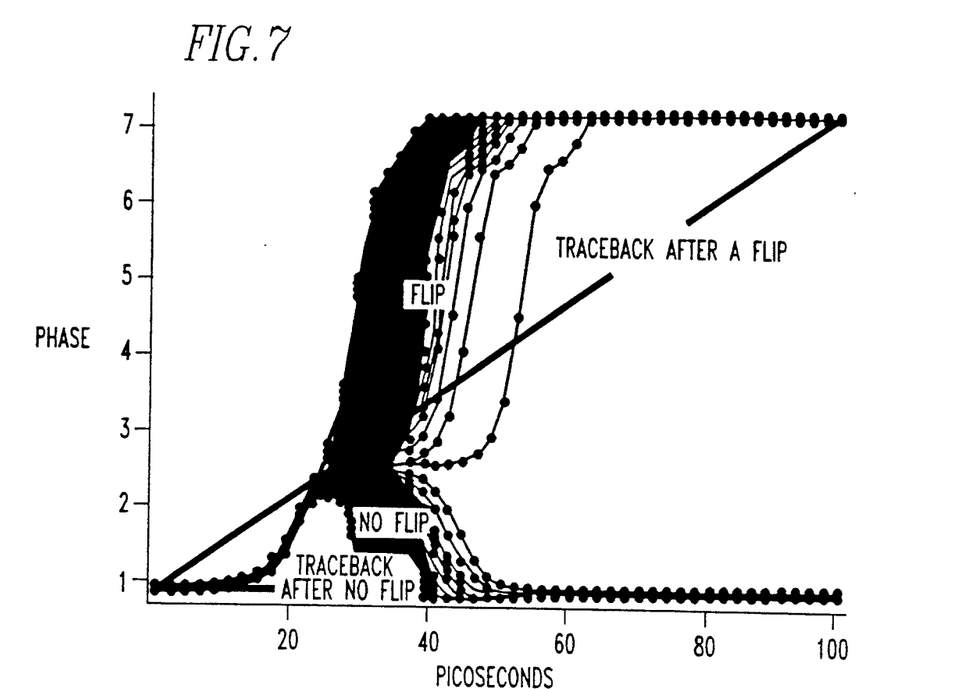
FIG. 7 is an oscilloscope reading of a typical operation of the improved modulator circuit of FIG. 5.

The effect of killing the inductor current in modulator 50 was demonstrated in a JSIM calculation of 390 sampling events. The phases plotted in FIG. 7 show that the trace back after a "flip" and the trace back after "no flip" returned to the same starting point. This linearized the response of the modulator 50, and provided improved performance over prior art modulator 10.

Figure 8:
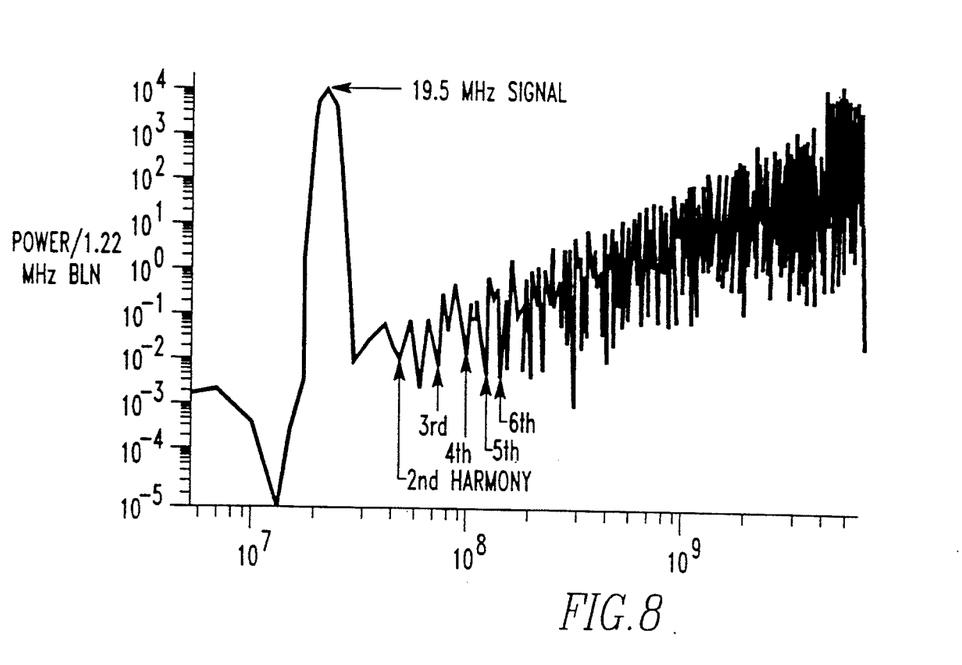
FIG. 8 is a plot of the FFT of the output data of the improved modulator circuit of FIG. 5.

Spur-free performance of improved modulator 50 was also demonstrated in a long JSIM calculation. Modulator 50 performed 10 GHz sampling of a 5 microvolt peak-to-peak, 19.5 MHz sine wave with 11 microvolts of DC offset. The FFT of the modular data$_{13}$ 1s and data_0s is plotted in FIG. 8. Arrows indicate the positions of the n=2, 3, 4, 5, and 6 harmonic frequencies. There is no indication any spurs were generated by the analog-to-digital converter. The limits of the data show that the SFDR is at least 58 dB. Thus, the improvement over the previous prior art modulator 10 was at least 29 dB of additional spur-free dynamic range.

The JSIM calculations conducted for improved modulator 50 were conducted on a single loop modulator. It is to be distinctly understood that the present invention can also be used to make improved comparators in two-loop modulators and in bandbass modulators. In all cases, this improvement will extend the spur-free dynamic range of the analog-to-digital converter.

Figure 9:
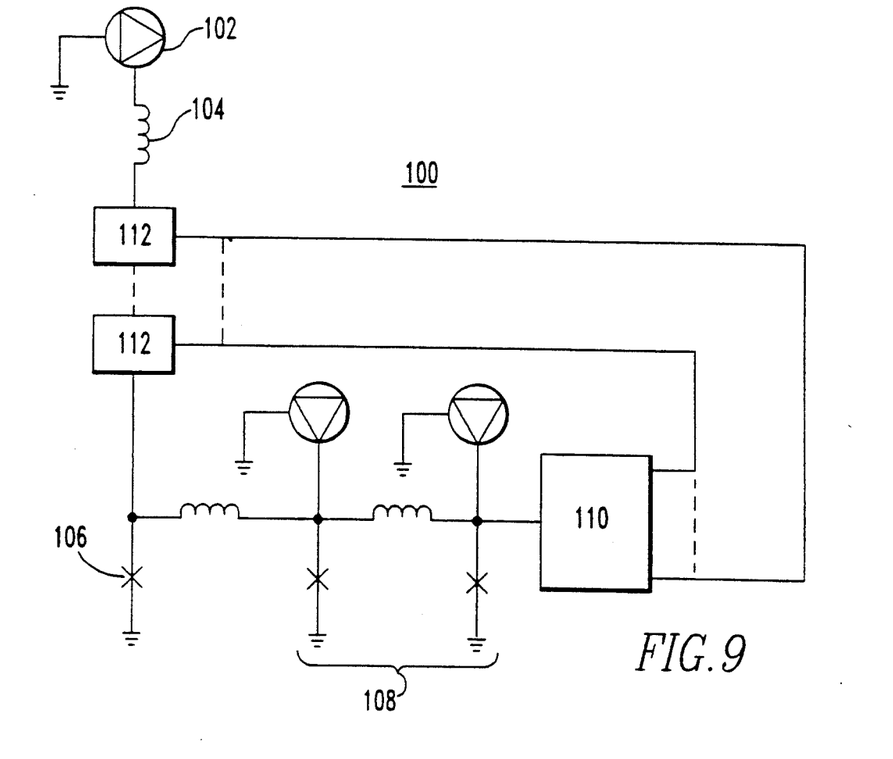
FIG. 9 is a schematic block diagram of the multiple flux quanta feedback circuit of the present invention.

A circuit which can provide a multiple digital pulse feedback is shown in FIG. 9. Therein, input signal voltage 102 is applied to input inductor 104. The input signal voltage 102 increases the current through inductor 104 linearly, as the time integral of the signal voltage. When this current exceeds the Josephson critical current of the quantizing junction 106, a SFQ voltage pulse is produced. This voltage pulse reduces the current through the input inductor 104 by $\phi_o/L$ input, an amount corresponding to one flux quantum. After propagation through a Josephson transmission line 108, this voltage pulse is split into multiple pulses through SFQ Split Buffers 110. These multiple pulses are fed back to the input inductor 104 through feedback pulse generators 112, which further reduce the current through the input inductor by an amount corresponding to these multiple flux quanta. In order to produce $2^n+1$ multiple flux quanta, $2^n$ feedback pulse generators 112 and $2^n-1$ split buffers 110 are required.

Figure 10:
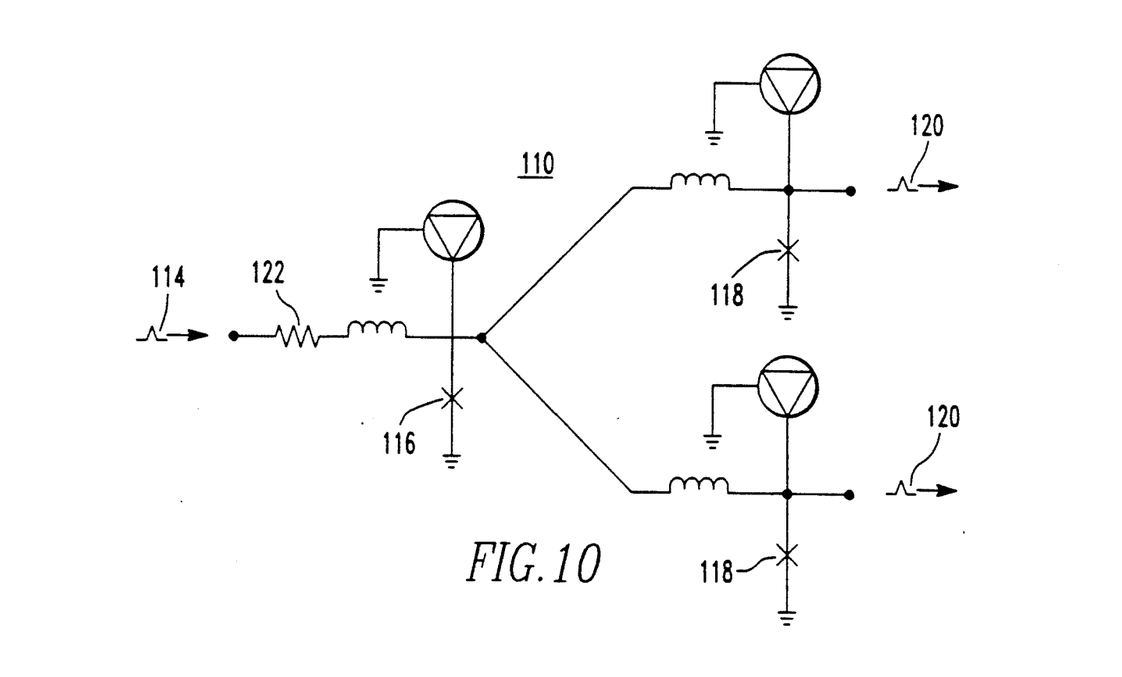
FIG. 10 is a schematic diagram of one stage of the split buffer used in the multiple flux quanta feedback circuit of FIG. 9.

FIG. 10 shows the circuit schematic of the single stage split buffer 110. An incoming SFQ pulse 114 to the split buffer 110 causes the input Josephson junction 116 to pulse. This adds current through the two output Josephson junctions 118 momentarily, which generates two SFQ output pulses 120. Damping resistor 122 in the circuit insures the dissipation of any flux trapped in the circuit during the circuit operation. By attaching two split buffers 110 to the output of this single stage split buffer 110, $2^2$ SFQ pulses can be generated. In a similar way, $2^n$ SFQ pulses are generated with $(2^n-1)$ split buffers 110.

Figure 11:
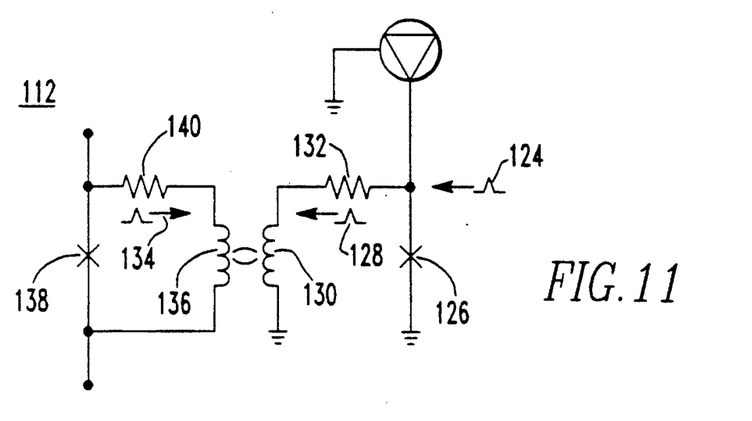
FIG. 11 is a schematic diagram of one stage of the feedback pulse generator used in the multiple flux quanta feedback circuit of FIG. 9.

Each of the $2^n$ SFQ pulses 120 is fed back to the input inductor 104 through a feedback pulse generator 112, resulting in $(2^n+1)$ flux quanta feedback. The circuit schematic of feedback pulse generator 112 is shown in FIG. 11. The input pulse 124 drives the coupling Josephson junction 126 to pulse and induces a circulating current 128 through the coupling inductor 130 during the time $\tau_{couple}$. The value of time $\tau_{couple}$ is a relationship between the value of coupling inductor 130 and coupling resistor 132. During time $\tau_{couple}$, circulating current 128 induces a circulating current 134 through feedback inductor 136 which is inductively coupled to coupling inductor 130. This circulating current 134 through feedback inductor 136 cause feedback Josephson junction 138 to pulse, resulting in one flux quantum of feedback to the input inductor current. The circulating current 134 through feedback inductor 136, induced by the feedback Josephson junction 138 pulse, is dissipated in time $\tau_{feedback}$. Time $\tau_{feedback}$ is a relationship between feedback inductor 136 and feedback resistor 140. After the greater of time $\tau_{couple}$ or time $\tau_{feedback}$, the feedback pulse generator 112 is ready for the next input pulse. The usual values for time $\tau_{couple}$ and time $\tau_{feedback}$ range from 10 to 50 picoseconds for multigigahertz operation.

Figure 12:
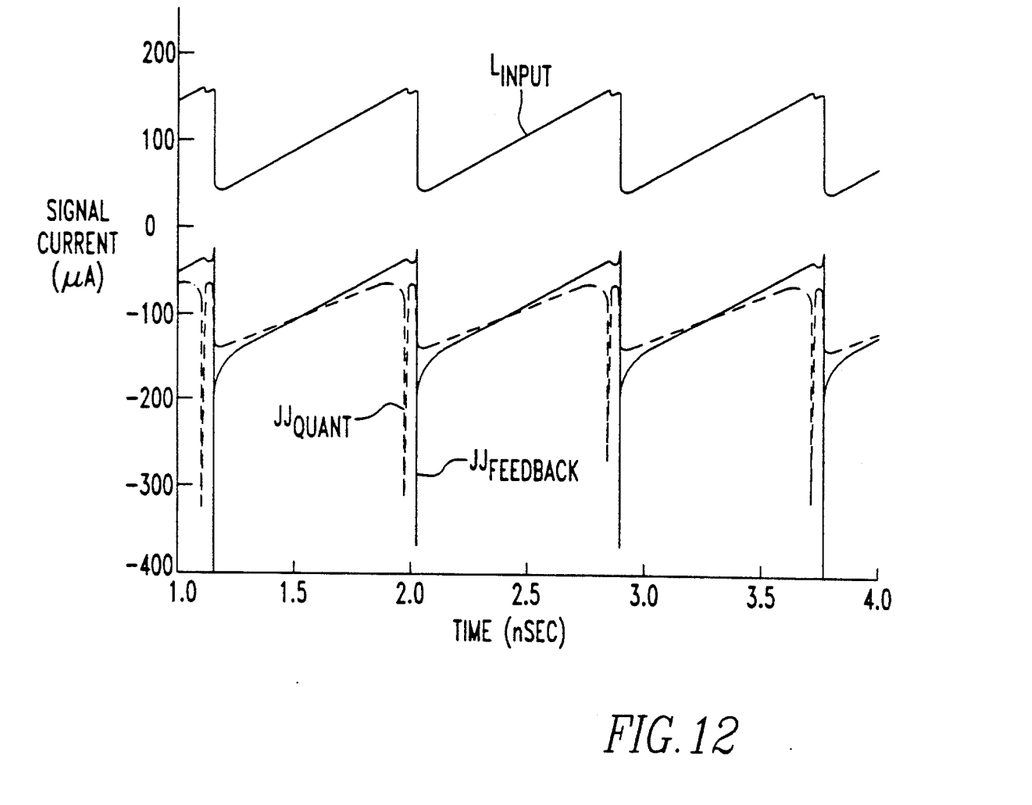
FIG. 12 is a graph showing the JSIM performance of the multiple flux quanta feedback circuit of FIG. 9.

The circuit of FIG. 9 was simulated with the computer program JSIM, a modified SPICE program with a Josephson junction model. FIG. 12 shows the result of the simulation for the circuit with $(2^4-1)$ split buffers 110 to induce $(2^4+1)$ feedback pulses. FIG. 12 plots the current through input inductor 104. With constant voltage applied to inductor 104, the current ramps linearly. When the quantizing Josephson junction is pulsed, shown in FIG. 12 as a current spike, there is a feedback of one SFQ pulse to the input inductor 104. This is shown as a small drop in the current through $L_{input}$, which occurred at the same time as the quantizing Josephson junction pulse. Feedback of $2^4$ SFQ pulses followed after a time delay through the split buffers 110. This caused the big drop in the current through $L_{input}$ which occurred at the same time when the feedback Josephson junction 138 pulsed.

Simulations for more than 100,000 feedback pulses showed very regular patterns of the signals on the various circuit components and no sign of instability. When the pulse feedback was constructed with only inductors, without the feedback Josephson junction and resistances in FIG. 11, the circuit could hold only a finite number of pulses. This resulted in a slow drift of the current bias on the coupling Josephson junction and eventually circuit failure.

The speed of feedback circuit 100 is limited by the time delay through the $(2^n-1)$ split buffers 110, $n\tau_o$, where $\tau_o$ is the time delay through one split buffer 110. With the Josephson junctions having the parameters of $I_cR_n=300$ μV and Ic=100 μA, $\tau_o$ is about 10 picoseconds. $\tau_o$ can be reduced to only a few picoseconds using Josephson junctions with larger $I_cR_n$ values. With $I_cR_n=600$ μV, a 129 flux quanta feedback circuit may be operated at speeds up to 25 GHz, while consuming only about 25 μW.

A successful operation of 129 $\phi_o$ feedback was demonstrated through JSIM simulation. Such a feedback is sufficient for a two loop lowpass (bandpass) modulator for an analog-to-digital conversion with 16 bits of dynamic range for 50 MHz bandwidth signals. This feedback circuit 100 is compatible with currently available high $T_c$ Josephson junctions because only non hysteretic junctions were used.

In the foregoing specification certain preferred practices and embodiments of this invention have been set out, however, it will be understood that the invention may be otherwise embodied within the scope of the following claims.

We claim:

1. A spur free sigma-delta modulator analog-to-digital converter for converting an analog input signal to a digital output signal, said converter comprising:
   a. integrating inductor means connected to said analog input signal;
   b. pulse generator means connected to said integrating inductor means, said pulse generator means creating a sampling pulse;
   c. quantizer means connected to said integrating inductor means, said quantizer means including a comparator Josephson junction which measures the current in said integrating inductor means and said sampling pulse and produces an output pulse when the current in said integrating inductor means and said sampling pulse exceeds a predetermined level; and
   d. a race Josephson junction provided between said pulse generator means and said integrating inductor means, said race Josephson junction emitting a voltage pulse in response to every sampling pulse, said voltage pulse killing any retained persistent current in said pulse generator means.

2. The converter of claim 1 wherein said pulse generator means comprises a pulse generator and a pulse sharpener which produce said sampling pulse and a sampling inductor through which said sampling pulse is carried to said integrating inductor means.

3. The converter of claim 2 further comprising a buffer junction which pulses when said comparator Josephson junction pulses to kill any retained current in said sampling inductor.

4. The converter of claim 1 further comprising a resistor provided between said pulse generator means and said quantizer means.

5. A multiple flux quanta feedback generator for creating a multiple digital pulse feedback in response to an input signal comprising:
   a. input inductor means connected to said input signal;
   b. quantizing means connected to said input inductor means, said quantizing means producing a pulse when the current produced by said input inductor means exceeds a predetermined amount;
   c. $2^n-1$ splitting means connected to said quantizing means for producing $2^n$ output pulses, each of said splitting means producing two output pulses in response to a single pulse produced by said quantizing means; and
   d. $2^n$ feedback pulse generator means, each of said feedback pulse generator means connected to one of said output pulses to produce $2^n+1$ flux quanta feedback, said flux quanta feedback being fed back to said input inductor means.

6. The multiple flux quanta generator of claim 5 wherein each of said splitting means comprises an input Josephson junction adapted to receive said pulse generated by said quantizing means and damping resistance means for dissipating flux trapped in said splitting means during operation.

7. The multiple flux quanta generator of claim 5 wherein each of said feedback pulse generator means comprises a coupling circuit connected to one of said output pulses and a feedback circuit inductively coupled to said coupling circuit.

8. The multiple flux quanta generator of claim 7 wherein said coupling circuit comprises a coupling Josephson junction and a coupling inductor, said coupling Josephson junction pulsing in response to said one of said output pulses and inducing a circulating current in said coupling inductor.

9. The multiple flux quanta generator of claim 7 wherein said feedback circuit comprises a feedback Josephson junction and a feedback inductor, said feedback inductor producing a feedback circulating current through mutual inductance with said coupling inductor and inducing said feedback Josephson junction to pulse.

* * * * *